United States Patent
Kobayashi et al.

(10) Patent No.: US 8,164,131 B2
(45) Date of Patent: Apr. 24, 2012

(54) NONVOLATILE SEMICONDUCTOR MEMORY DEVICE AND METHOD OF MANUFACTURING THE SAME

(75) Inventors: Toshio Kobayashi, Kanagawa (JP); Saori Hara, Tokyo (JP)

(73) Assignee: Sony Corporation, Tokyo (JP)

( * ) Notice: Subject to any disclaimer, the term of this patent is extended or adjusted under 35 U.S.C. 154(b) by 332 days.

(21) Appl. No.: 11/633,292

(22) Filed: Dec. 4, 2006

(65) Prior Publication Data
US 2007/0145448 A1    Jun. 28, 2007

(30) Foreign Application Priority Data
Dec. 6, 2005    (JP) .................. 2005-352227

(51) Int. Cl.
    *H01L 27/108*    (2006.01)
    *H01L 29/94*    (2006.01)
(52) U.S. Cl. ........ 257/298; 257/316; 257/317; 257/645; 438/257; 438/288; 438/201; 438/255; 438/398
(58) Field of Classification Search .................. 257/347, 257/315, 316, 317, E21.679, E29.309, E21.21, 257/E21.423, E21.309, 321, 322, 645, 405, 257/651, 320, 319, 355, 314, 326, 298, 311, 257/312, 304, 296, 406; 438/257, 288, 258, 438/201, 211, 398, 255
See application file for complete search history.

(56) References Cited

U.S. PATENT DOCUMENTS

| | | | | |
|---|---|---|---|---|
| 6,894,924 B2* | 5/2005 | Choi et al. | ............... | 365/185.01 |
| 7,521,317 B2* | 4/2009 | Li et al. | .......................... | 438/257 |
| 2004/0004251 A1* | 1/2004 | Madurawe | ..................... | 257/347 |
| 2004/0218413 A1* | 11/2004 | Ishidao et al. | ................ | 365/103 |
| 2007/0023808 A1* | 2/2007 | Specht et al. | ................. | 257/296 |
| 2007/0212832 A1* | 9/2007 | Orlowski | ...................... | 438/257 |
| 2007/0232041 A1* | 10/2007 | Choi et al. | .................... | 438/585 |

FOREIGN PATENT DOCUMENTS
JP    2005-277032    10/2005
* cited by examiner

*Primary Examiner* — Ha Tran T Nguyen
*Assistant Examiner* — Thanh Y Tran
(74) *Attorney, Agent, or Firm* — Robert J. Depke; Rockey, Depke & Lyons, LLC

(57) ABSTRACT

A nonvolatile semiconductor memory device includes: a first semiconductor region having first conductivity; a channel formation region in which a channel inversion layer having second conductivity is formed; a second semiconductor region having the second conductivity; a third semiconductor region having the second conductivity; a laminated insulating film formed on the channel formation region; and a control electrode formed on the laminated insulating film. The laminated insulating film includes a first insulating film, a charge storage film, and a second insulating film in order from the channel formation region side. The control electrode extends to above one of the second semiconductor region and the third semiconductor region. The charge storage film present between an extended portion of the control electrode and the second semiconductor region or the third semiconductor region is removed and a portion where the charge storage film is removed is filled with a third insulating film.

3 Claims, 14 Drawing Sheets

NONVOLATILE SEMICONDUCTOR MEMORY DEVICE AND METHOD OF MANUFACTURING THE SAME

CROSS-REFERENCES TO RELATED APPLICATIONS

The present invention contains subject matter related to Japanese Patent Application JP 2005-352227 filed in the Japanese Patent Office on Dec. 6, 2005, the entire contents of which being incorporated herein by reference.

BACKGROUND OF THE INVENTION

1. Field of the Invention

The present invention relates to a nonvolatile semiconductor memory device of a so-called MONOS (metal oxide nitride oxide silicon) type or the like that has a first insulating film, a charge storage film having a charge storage ability, and a second insulating film between a channel formation region, in which a channel inversion layer is formed, and a control electrode and a method of manufacturing the nonvolatile semiconductor memory device.

2. Description of the Related Art

A so-called MONOS memory transistor is known as a nonvolatile memory device of a trap gate type that stores charges in a charge trap in an insulating film.

Usually, in the case of a MONOS memory transistor of an N-channel type, a so-called ONO (Oxide-Nitride-Oxide) film is formed over the entire region between a P-type semiconductor layer (a P well), which includes a surface region (a channel formation region) in which a channel inversion layer (an N-type inversion layer) is formed, and a gate electrode.

As a method of writing and erasing memory of the MONOS memory transistor, there are the following two methods (a first method and a second method). As an example, bias application conditions for the N-channel type MONOS memory transistor are described below.

In the first method, a high voltage is applied a region between the gate electrode and the channel formation region to inject charges from the entire surface of the channel formation region into, in particular, a nitride film (a form of a charge storage film) in the ONO film using a tunnel current. When injection of electrons is defined as writing and drawing of electrons is defined as erasing, a positive bias is applied to the gate electrode at the time of the writing and a negative bias is applied to the gate electrode at the time of the erasing.

In the second method, the MONOS memory transistor is caused to perform a MOS operation. Injection of electrons is defined as writing and injection of holes electrically offsetting the injected electrons is defined as erasing. In the writing, a positive bias is applied to a drain and a positive bias is applied to a gate with a source as a reference to form a channel inversion layer and electros flowing in the channel inversion layer are made hot and injected into a region near the drain, that is, a local portion of a charge storage film in the ONO film (channel hot electron (CHE) injection). In the erasing, a negative bias is applied to the gate and a positive bias is applied to the drain to inject holes made hot, that is, hot holes caused by, for example, band-to-band tunneling at a drain end into a local portion of the charge storage film (the region near the drain) into which the electrons have already been injected. Consequently, the electrons injected earlier are electrically neutralized and a memory state is erased.

However, in the first method, a high voltage is necessary for the writing and the erasing. In the second method, although a voltage for the writing is low, a large amount of an electric current is necessary for the writing.

It is known that, when the writing (injection of electrons) and the erasing (injection of holes) are repeated using the second method, as the number of times of the erasing (injection of holes) increases, a retention characteristic is deteriorated (a retention time decreases).

As a cause of the deterioration in the holding characteristic, it is considered that, as the number of times of the erasing (injection of holes) increases, residual holes injected into the charge storage film but not used for actual erasing (recombination with electrons) are stored in a place shifted from an injection position of electrons injected, the residual holes spread as time elapses to recombine with the electrons injected, and the holes deteriorate the retention characteristic.

As measures against the deterioration in the retention characteristic, there is known a MONOS memory transistor having a structure in which a composition of a local portion of a film in a lowermost layer (hereinafter referred to as potential barrier film) in the ONO film is made different from that of the other portions (see, for example, JP-A-2005-277032).

In a technique disclosed in JP-A-2005-277032, a composition of a local portion of a potential barrier film and a position and a size (or a plane shape) of the local portion in the potential barrier film are appropriately set such that, for charges that spread when the charges are stored, the distribution of the charges can be narrowed or an amount of injection of the charges can be controlled. As a result, a range of injection of the charges into a charge storage layer is limited to some extent to control the spread of the distribution.

SUMMARY OF THE INVENTION

However, since there is a limit in control of a potential barrier, a more effective structure for preventing remaining of charges (in the above example, holes) is strongly demanded.

Therefore, it is desirable to provide a nonvolatile semiconductor memory device having a structure in which remaining and storage of unnecessary charges less easily occur even if rewriting is repeated and a method of manufacturing the nonvolatile semiconductor memory device.

As a result of analyses by the inventors, it has been found that, as an injection time elapses, an injection position of holes moves from an overlap region of a gate electrode closer to a drain and a drain region to a region into which electrons determining a threshold are injected. It has also been found that unnecessary holes not used for actual erasing (recombination with electrons) remain in a region closer to the drain (gate-drain overlap region).

The invention has been made on the basis of these kinds of knowledge.

According to an embodiment of the invention, there is provided a nonvolatile semiconductor memory device including: a first semiconductor region having first conductivity; a channel formation region that is a surface portion of the first semiconductor region and in which a channel inversion layer having second conductivity is formed; a second semiconductor region that is in contact with the channel formation region and has the second conductivity; a third semiconductor region that is spaced apart from the second semiconductor region and in contact with the channel formation region and has the second conductivity; a laminated insulating film formed on the channel formation region; and a control electrode formed on the laminated insulating film. The laminated insulating film includes a first insulating film, a charge storage film having a charge storage ability, and a second insulating film in order from the channel formation region side. The control electrode extends to above one of the second semiconductor region and the third semiconductor region. The charge storage film present between an extended portion of the control electrode and the second semiconductor region or the third semiconductor region is removed. A portion where the charge storage film is removed is filled with a third insulating film having a charge storage ability lower than that of the charge storage film.

Preferably, the nonvolatile semiconductor memory device includes: a memory cell array in which memory cells including the first to the third semiconductor regions, the laminated insulating film, and the control electrode are integrated; and a peripheral circuit. In an operation object memory cell selected in the memory cell array, the peripheral circuit is capable of executing a first charge injecting operation for, biasing a region between the second semiconductor region and the first semiconductor region, biasing the control electrode to form an inversion layer channel in the channel formation region, and injecting first polarity charges into a local portion of the charge storage film on a side where the third insulating film is formed and a second charge injecting operation for, in reducing an amount of retained charges of the first polarity charges, biasing the second semiconductor region or the third semiconductor region on a side where the third insulating film is formed and the control electrode, causing band-to-band tunneling on a surface portion of the second semiconductor region or the third semiconductor region with which the third insulating film is in contact, and injecting second polarity charges caused by the band-to-band tunneling into the local portion of the charge storage film that retains the first polarity charges.

In the nonvolatile semiconductor memory device, one of the second semiconductor region and the third semiconductor region is laid on the control electrode on a pattern (i.e., in a top view). An insulating film structure in a portion where the control electrode and the second semiconductor region or the third semiconductor region overlap (hereinafter referred to as overlap region) is different from a laminated insulating film structure on the channel formation region. Specifically, whereas the laminated insulating film on the channel formation region has a three-layer structure including the first insulating film, the charge storage film, and the second insulating film in order from the channel formation region side, in the insulating film in the overlap region, at least a charge storage film portion is removed and the portion removed is filled with the third insulating film having a charge storage ability lower than that of the charge storage film.

Therefore, at the time of the first charge injecting operation and the second charge injecting operation executed by the peripheral circuit, even if charges are injected into the overlap region, the charges are not stored or least easily stored. Therefore, the charges hardly remain in this portion. In particular, even if the second polarity charges are injected into the overlap region at the time of the second charge injection operation, the second polarity charges immediately disappear. Thus, the second polarity charges less easily remain in this region.

In a method of manufacturing a nonvolatile semiconductor memory device according to an embodiment of the invention, a step of retracting the charge storage film and a step of filling the third insulating film are necessary. However, the nonvolatile semiconductor memory device having the structure described above is formed only by increasing the number of steps with the addition of these steps.

According to an embodiment of the invention, it is possible to provide a nonvolatile semiconductor memory device having a structure in which, even if rewriting is repeated, remaining and storage of unnecessary charges less easily occur and a method of manufacturing the nonvolatile semiconductor memory device.

DESCRIPTION OF THE PREFERRED EMBODIMENTS

As described above, the invention has been made on the basis of the two kinds of knowledge that (1) in injecting charges (second polarity charges) having a polarity opposite to that of first polarity charges already injected, as an injection time elapses, an injection position of the second polarity charges moves from an overlap region of a control electrode and a drain region to a region into which the first polarity charges determining a threshold are injected and (2) unnecessary second polarity charges not used for recombination with the first polarity charges remain in a control electrode-drain overlap region.

Therefore, in order to improve a retention characteristic, it is necessary to prevent the second polarity charges from remaining in the overlap region of the control electrode and the drain region. In an embodiment of the invention, a structure for attaining this intention and a method of manufacturing the structure are provided.

Figure 1A:
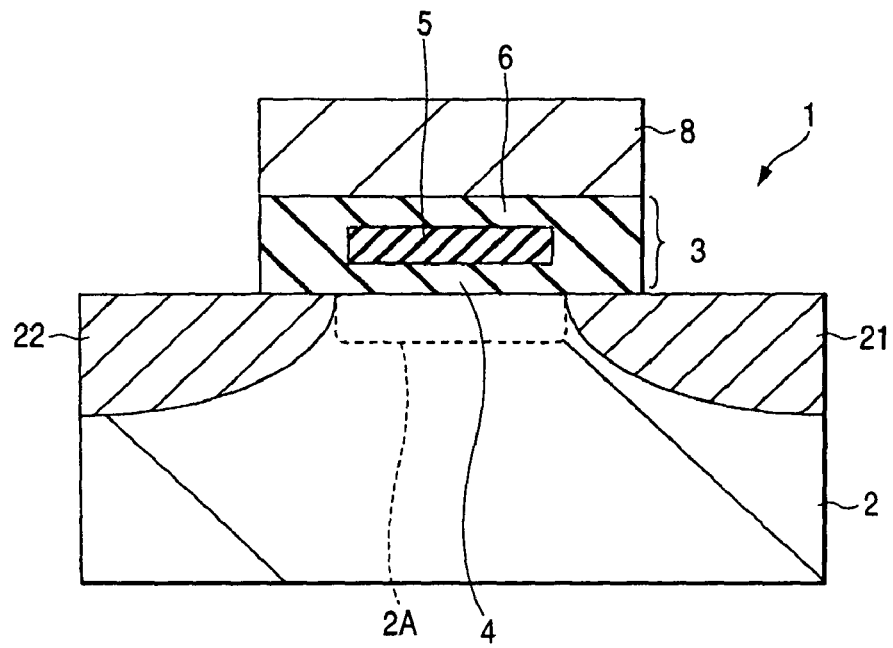
FIG. 1A is a sectional view of a MONOS memory transistor according to an embodiment of the invention.

In FIG. 1A, a structure of a nonvolatile memory transistor according to an embodiment of the invention is shown.

As an example, a structure of an N-channel type MONOS memory transistor is described. In this embodiment, the MONOS memory transistor has an ONO film as a laminated insulating film between a control electrode (a gate electrode) and a channel formation region. However, the laminated insulating film according to this embodiment only has to include a first insulating film, a charge storage film having a charge storage ability, and a second insulating film. The first and the second insulating films do not always have to be oxide films and the charge storage film does not always have to be a nitride film. For example, the charge storage film may be an oxide film or the like having conductive particulates embedded therein.

In the following explanation, the N-channel type MONOS memory transistor is described. In the case of a P-channel type MONOS memory transistor, it is possible to apply the following explanation to the MONOS memory transistor by analogy if a conductive type of impurities and a relation between potentials of a source and a drain at the time of operation are reversed from that in the N-channel type MONOS memory transistor.

A MONOS memory transistor 1 shown in FIG. 1A is formed on a P-type semiconductor substrate 2 serving as a first semiconductor region having first conductivity. In this explanation, a "semiconductor substrate" may be, other than a semiconductor substrate such as a P-type monocrystal silicon, a P-type well formed on a semiconductor substrate, a P-type semiconductor layer of a so-called SOI structure formed on a main surface of a substrate of semiconductor or other materials via an insulating layer, a P-type semiconductor material layer of a thin-film transistor formed in a laminated structure on a substrate, and the like.

Although not specifically shown in the figure, the MONOS memory transistor 1 constitutes a memory cell array obtained by arranging a large number of MONOS memory transistors 1. The MONOS memory transistors 1 are connected or coupled to one another by common lines in a row direction or a column direction, for example, bit lines and source lines. It is possible to apply a bias voltage to the MONOS transistors 1 via these common lines. A peripheral circuit that supplies a predetermined voltage to the respective common lines to actuate the memory cell array is provided around the memory cell array. As described later, according to a set bias of this peripheral circuit and common line switching control for bias application, for example, it is possible to realize writing according to hot electron injection and realize erasing according to hot hole injection due to band-to-band tunneling.

Two N-type semiconductor regions serving as second and third semiconductor regions having second conductivity, that is, a drain region 21 and a source region 22 are formed in the semiconductor substrate 2. Functions of a source and a drain may be interchanged between the drain region 21 and the source region 22. In that case, the semiconductor regions are referred to as "source/drain regions". In other words, although charges are injected into a region near the drain, in this embodiment, it is also possible to perform 2-bit storage by interchanging the functions of the source and the drain. For simplification of the explanation, the functions of the source and the drain are fixed as the drain region 21 and the source region 22.

A surface portion (a broken line portion in FIG. 1A) of the semiconductor substrate 2 between the drain region 21 and the source region 22 is referred to as a "channel formation region". A channel formation region 2A is, in this example, a region in which an N-type channel inversion layer is formed at the time of operation.

A laminated insulating film 3 made of plural insulating films and the like is formed on the semiconductor substrate 2. A gate electrode 8 is formed on the laminated insulating film 3.

The gate electrode 8 has a single-layer structure of doped polysilicon added with impurities or a two-layer structure of doped polysilicon and a high-melting point metal alloy (silicide) layer. The gate electrode 8 is located with a position above the channel formation region 2A as the center. However, the gate electrode 8 extends to above the drain region 21. Ends of the gate electrode 8 and the drain region 21 overlap each other. A portion of the laminated insulating film 3 on the end of the drain region that the gate electrode 8 overlaps is referred to as an "overlap region". The laminated insulating film 3 has different film structures in an overlap region 3A and a region (a charge storage region) 3B adjacent to the overlap region 3A.

Figure 1B:
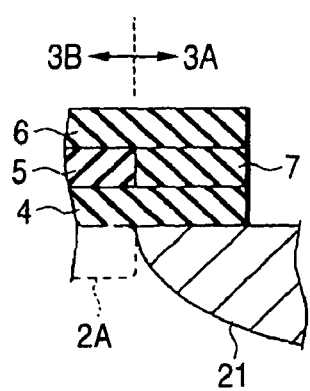
FIGS. 1B to 1D are diagrams showing examples of a structure of a part of the MONOS memory transistor.
Figure 1C:
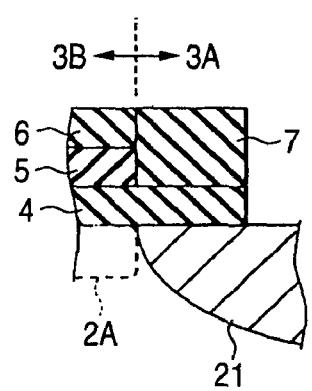
Figure 1D:
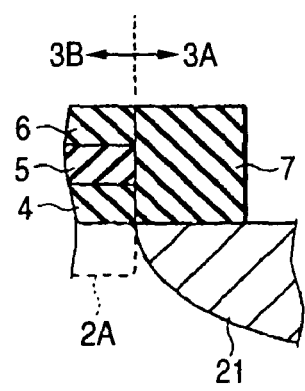

In FIGS. 1B to 1D, examples of a structure of the overlap region 3A are shown.

In all the example of the structure in FIGS. 1B to 1D, the charge storage region 3B include a first insulating film 4, a charge storage film 5, and a second insulating film 6 in order from a bottom layer.

In a first example of the structure shown in FIG. 1B, the second insulating film 6 and the first insulating film 4 extend to the overlap region 3A. A third insulating film 7 having substantially the same thickness as that of the charge storage film 5 is formed between a second insulating film portion and a first insulating film portion of the overlap region 3A.

In a second example of the structure shown in FIG. 1C, the first insulating film 4 extends to the overlap region 3A. The third insulating film 7 having substantially the same thickness as a total thickness of the charge storage film 5 and the second insulating film 6 is formed on the first insulating film 4.

In a third example of the structure shown in FIG. 1D, the third insulating film 7 having substantially the same thickness as a total thickness of the first insulating film 4, the charge storage film 5, and the second insulating film 6 is formed on the drain region 21.

It is possible to form the first insulating film 4 and the second insulating film 6 from an $SiO_2$ film, an SiON film, a laminated film of the $SiO_2$ film and the SiON film, or the like.

The charge storage film 5 is an insulating film made of a material having a charge trap density higher than those of the first insulating film 4 and the second insulating film 6. The charge storage film 5 is made of, for example, an SiN film. The charge storage film 5 may be formed from a metal oxide film having a charge trap density higher than that of the $SiO_2$ film.

The third insulating film 7 is an insulating film made of a material having a charge trap density lower than that of the charge storage film 5. The third insulating film 7 is made of, for example, the $SiO_2$ film.

The first insulating film 4 may be formed from an insulating material having different heights of a potential barrier in the overlap region 3A and the charge storage region 3B.

Figure 2:
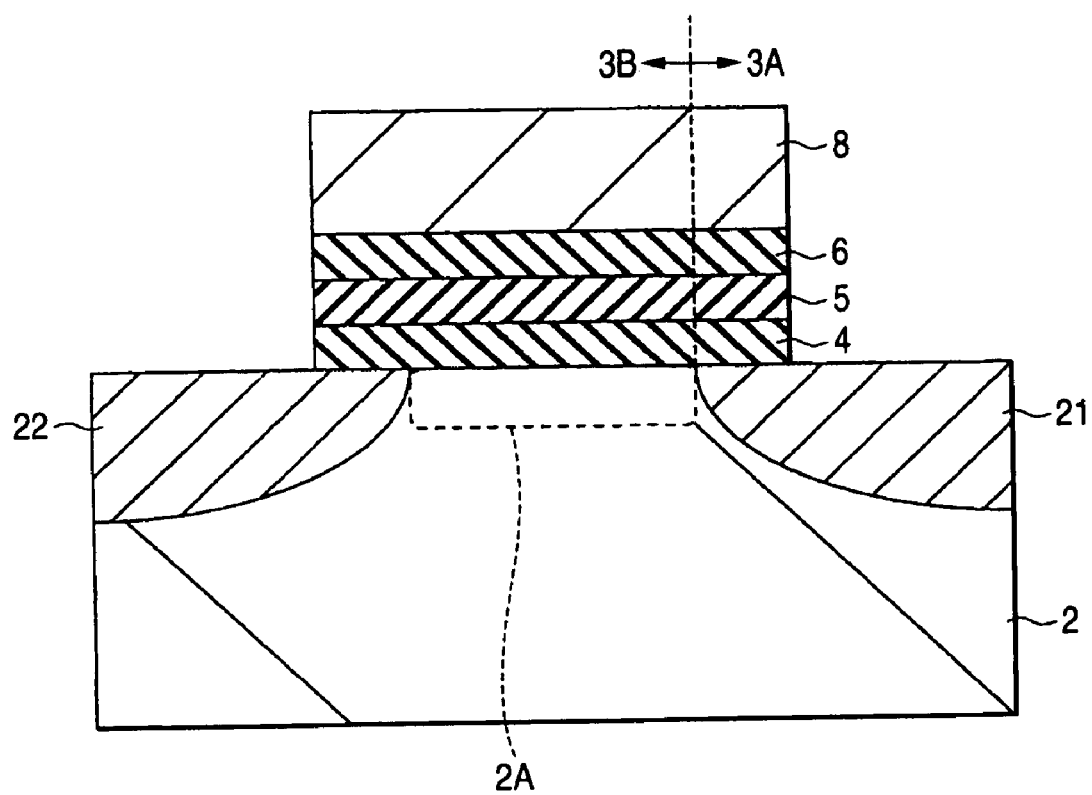
FIG. 2 is a sectional view of a MONOS memory transistor according to a comparative example.

In FIG. 2, a sectional view of a general MONOS memory transistor, to which the invention is not applied, is shown as a comparative example.

In a structure shown in FIG. 2, the charge storage film 5 is present in the overlap region 3A of the gate electrode 8 and the drain region 21. Therefore, there is no difference in charge storage abilities in the overlap region 3A and the charge storage region 3B of the laminated insulating film.

On the other hand, in the examples of the structure shown in FIGS. 1B to 1D, the overlap region 3A is excluded from a region in which mainly charge storage is possible. Even if charges are injected into the overlap region 3A, it may be impossible to store the charges.

A method of manufacturing the MONOS memory transistor 1 having the structure shown in FIGS. 1A to 1D will be explained. In this explanation, a method of manufacturing the MONOS memory transistor 1 having the structure shown in FIG. 1B is described. Thickness and manufacturing conditions described below are only examples and not limited to the examples.

FIG. 3A to FIG. 12B are sectional views at the time of the manufacturing.

In steps corresponding to FIG. 3A to FIG. 4B, isolation is performed according to a LOCOS (Local Oxidation of Silicon) method. As a method other than the LOCOS method, it is also possible to adopt, for example, an STI (Shallow Trench Isolation) method.

Figure 3A:
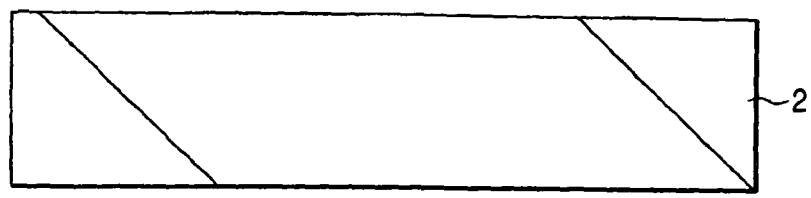
FIGS. 3A to 3C are sectional views of steps from substrate cleaning to pattern formation for LOCOS oxidation.
Figure 3B:
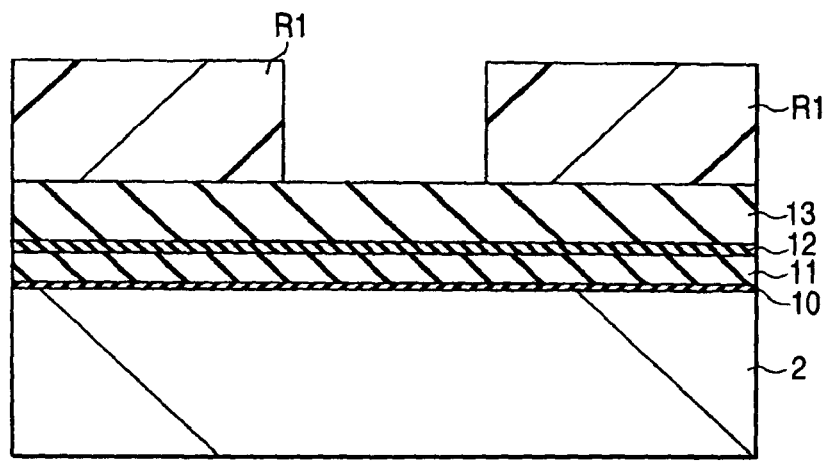

After the semiconductor substrate 2 prepared is cleaned (FIG. 3A), a pad oxide film 10 having thickness of 5 [nm] is formed by thermally oxidizing the surface of the substrate. Subsequently, a polysilicon film 11 having thickness of 48 [nm] for controlling distortion of a pad is deposited according to the CVD method. The surface of the polysilicon film 11 is thermally oxidized to form an oxide film 12 having thickness of 8 [nm]. Thereafter, an oxidized protective film made of a nitride film 13 having thickness of 100 [nm] is deposited according to the CVD method. A resist R1 opened in a device isolation portion is formed on the nitride film 13 (FIG. 3B).

Figure 3C:
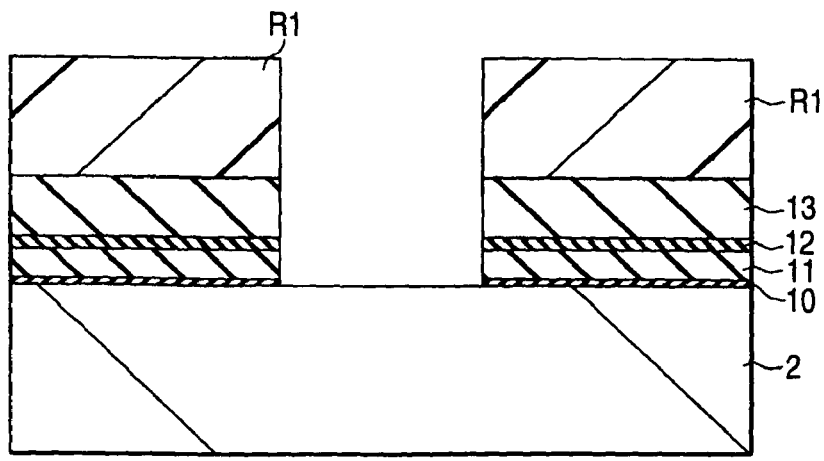

The nitride film 13, the oxide film 12, the polysilicon film 11, and the pad oxide film 10 in a portion exposed in the opening of the resist R1 are sequentially removed by etching (FIG. 3C).

Figure 4A:
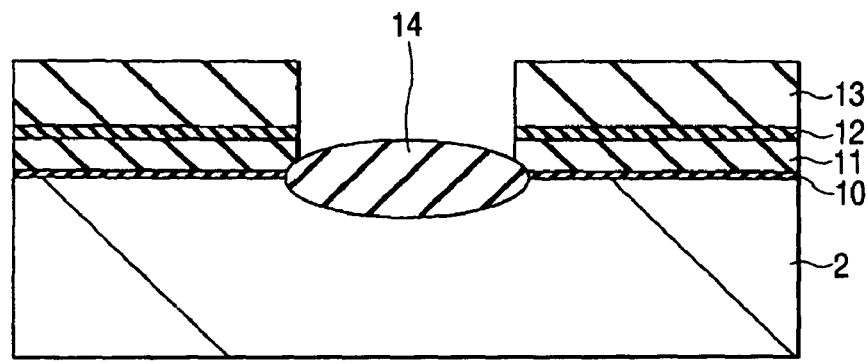
FIGS. 4A and 4B are sectional views of steps up to the LOCOS oxidation.

After the resist R1 is removed, the semiconductor substrate 2 exposed is oxidized with the nitride film 13 as an oxidation protective film to form a LOCOS 14 having thickness of 400 [nm] (FIG. 4A).

Figure 4B:
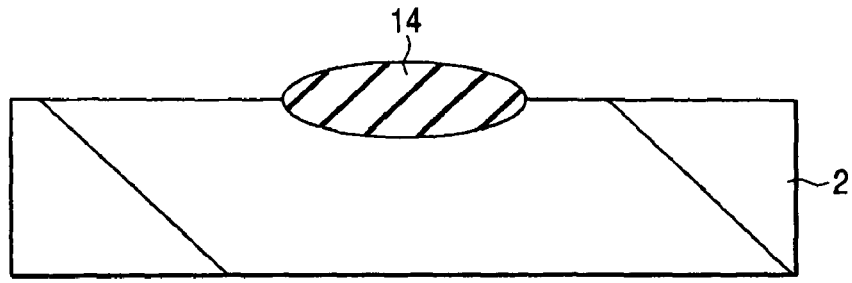

The pad oxide film 10, the polysilicon film 11, the oxide film 12, and the nitride film 13, which are not necessary any more, are removed by etching (FIG. 4B).

Figure 5A:
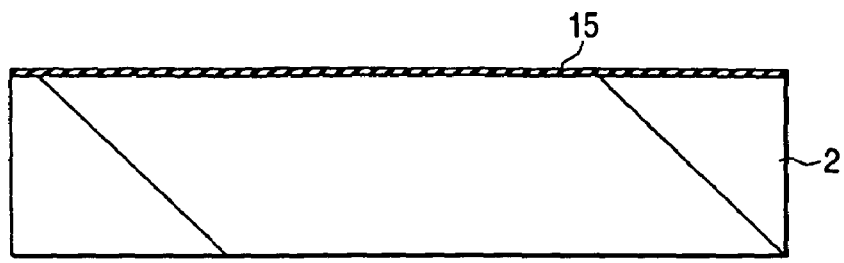
FIGS. 5A to 5C are sectional views at the time of well formation.
Figure 5B:
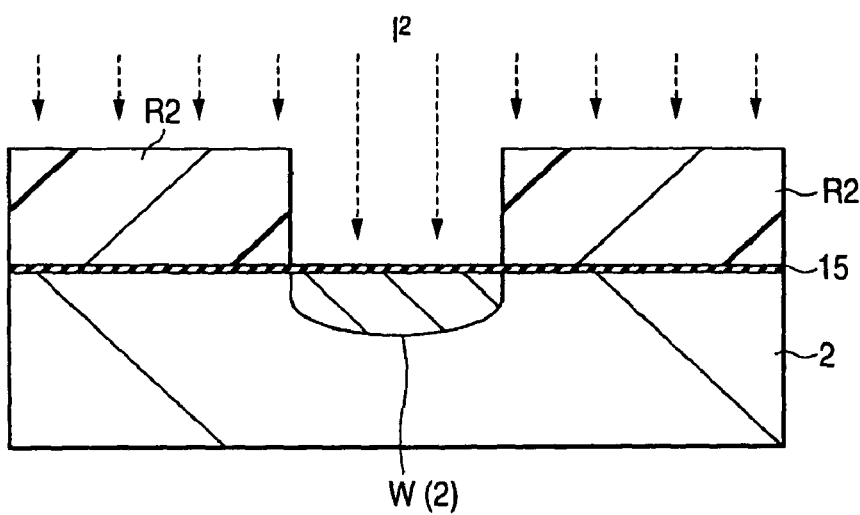
Figure 5C:
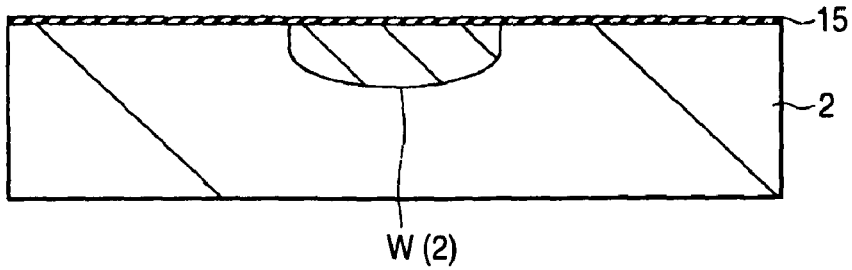

In steps corresponding to FIGS. 5A to 5C, a well W is formed in the semiconductor substrate 2.

After the surface of the semiconductor substrate 2 having a device isolation insulating layer (the LOCOS 14) formed therein by the method described above is cleaned, an ion injection protective film (a through film) 15 having thickness of 30 [nm] is formed by thermal oxidation (FIG. 5A).

Subsequently, wells are formed. A P well and an N well are formed in substantially the same steps except that only impurities and ion injection conditions are different. As an example, formation of the P well is described.

A resist R2 for protecting a portion where the P well is not formed is formed on the through film 15. Ion injection of P-type impurities (boron) through the through film 15 is performed with the through film 15 as a mask to form the well W (FIG. 5B). As the ion injection conditions, energy is 100 [KeV] and a dose is $4 \times 10^{12}$ [cm$^2$].

After the well W is formed, the resist R2 is removed (FIG. 5C).

The well W corresponds to the semiconductor substrate 2 in FIG. 1A. The well in this case is hereinafter denoted by reference sign "W(2)".

Figure 6A:
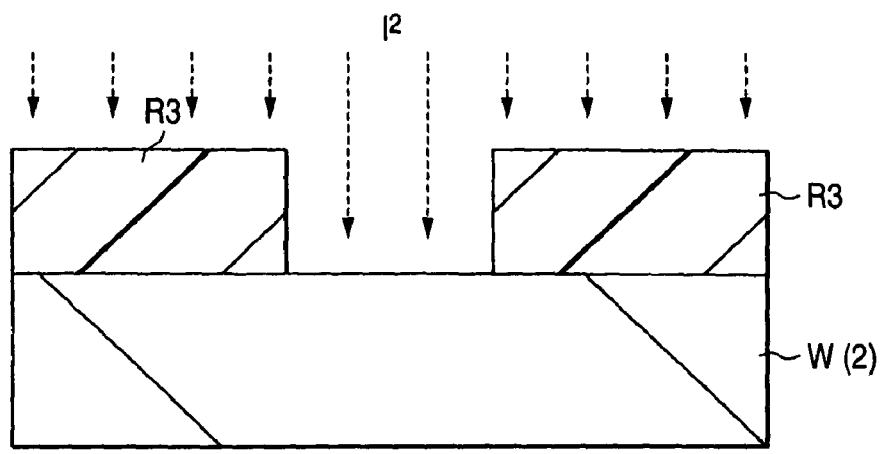
FIGS. 6A and 6B are sectional views of steps up to ONO film formation.

Channel impurities are introduced in a step corresponding to FIG. 6A.

After a resist R3 is formed, channel impurities are introduced by ion injection with the resist R3 as a mask to adjust a threshold voltage. Consequently, density of the channel formation region 2A (FIG. 1A) is roughly determined in a surface portion in the well W(2). In this case, the ion injection is performed twice. As conditions for the first ion injection, energy is 15 [KeV] and a dose is $2 \times 10^{11}$ [cm$^2$]. As conditions for the second ion injection, energy is 60 [KeV] and a dose is $1 \times 10^{12}$ [cm$^2$].

The step in FIG. 6A may be performed in a state in which the through film 15 in FIG. 5C is left.

Figure 6B:
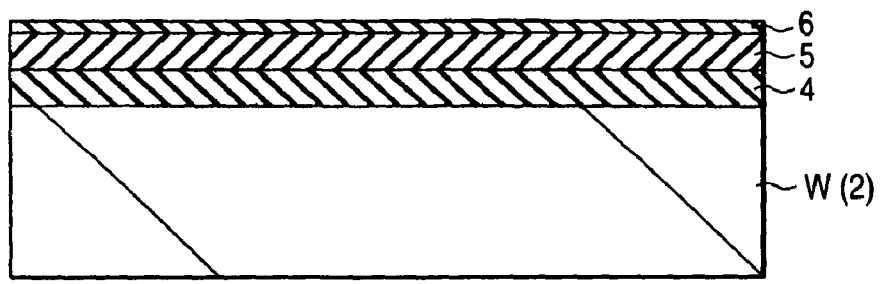

In a step corresponding to FIG. 6B, after the resist R3 (and the through film 15) is removed and the semiconductor substrate 2 is cleaned, an ONO film is formed as the laminated insulating film 3.

In the formation of the ONO film, the surface of the substrate is thermally oxidized to form the first insulating film (SiO$_2$ film) 4 having thickness of 8 [nm] and the charge storage film (SiN film) 5 having thickness of 8 [nm] is deposited on the first insulating film 4 according to the CVD method. An oxide film is deposited on the charge storage film 5 according to the CVD method or the surface portion of the charge storage film 5 is thermally oxidized to form the second insulating film (SiO$_2$ film) 6 having thickness of 5 [nm]. In the case of thermal oxidation, the charge storage film 5 is deposited rather thick (e.g., 11 [nm]) in advance. Thereafter, the surface of the charge storage film 5 is thermally oxidized. Finally, the charge storage film 5 having thickness of 8 [nm] and the second insulating film 6 having thickness of 5 [nm] are formed.

Figure 7A:
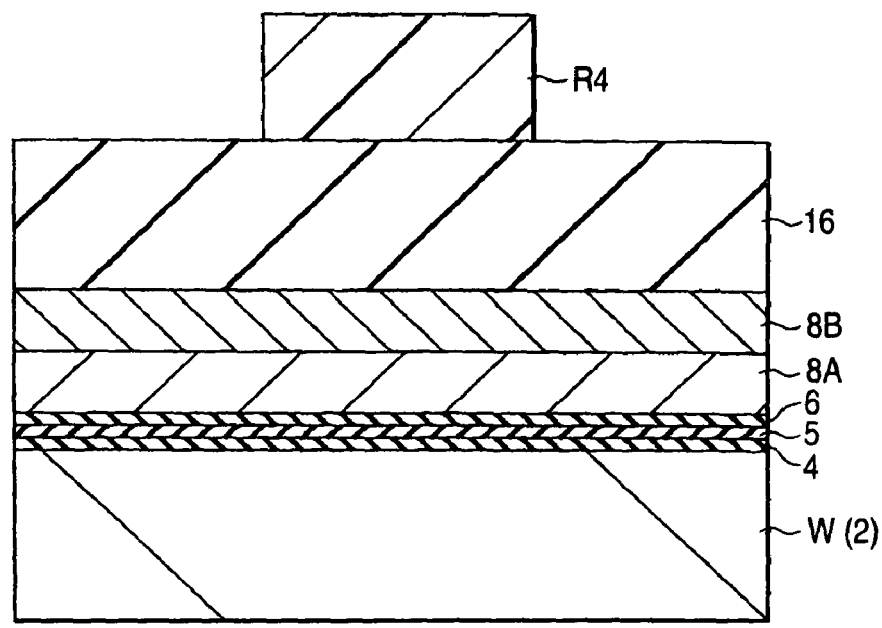
FIGS. 7A and 7B are sectional views of steps up to oxide film patterning for gate etching.
Figure 7B:
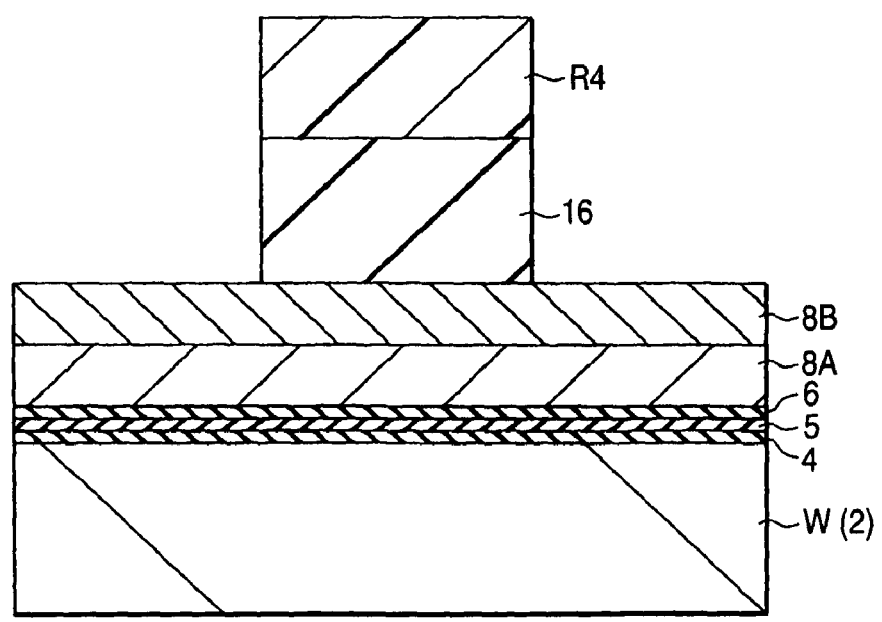
Figure 8:
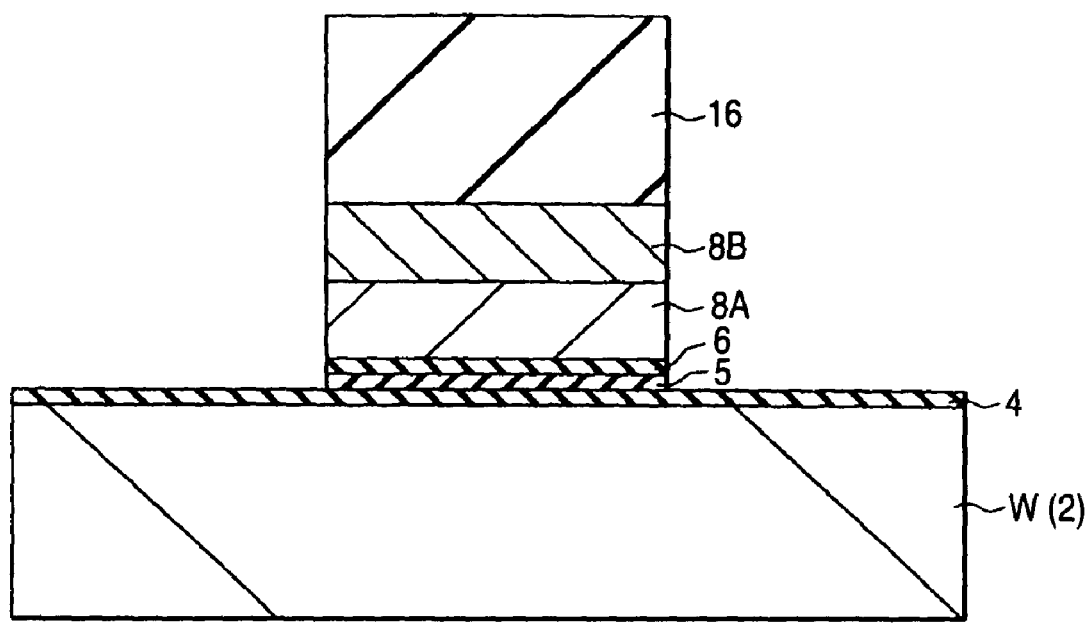
FIG. 8 is a sectional view after etching of a charge storage film.

In steps corresponding to FIG. 7A to FIG. 8, a gate electrode is formed.

Polysilicon 8A having thickness of 70 [nm] is deposited on the ONO film (the laminated insulting film 3), which is formed according to the method described above, according to the CVD method and phosphorus is doped in the polysilicon 8A. Although not specifically shown in the figure, the dope of phosphorus is performed at the time of deposit by the CVD method or performed by ion injection after non-doped polysilicon is deposited. Subsequently, a tungsten silicon film 8B having thickness of 70 [nm] is deposited on the polysilicon 8A and an oxide film 16 having thickness of 150 [nm] is further deposited on the tungsten silicon film 8B. A resist R4 of a gate pattern is formed on the oxide film 16 (FIG. 7A).

Only the oxide film 16 is etched with the resist R4 as a mask (FIG. 7B) and the resist R4 is removed.

The tungsten silicon film 8B, the doped polysilicon film 8A, and the ONO film are sequentially removed by etching with the remaining oxide film 16 as a mask. However, the etching of the ONO film is performed only up to the oxide film (the second insulating film 6) in the upper layer or the charge storage film 5 in the middle. At least the first insulating film 4 in the lower layer is left without being etched (FIG. 8). In FIG. 8, the second insulating film 6 and the charge storage film 5 are removed.

Figure 9A:
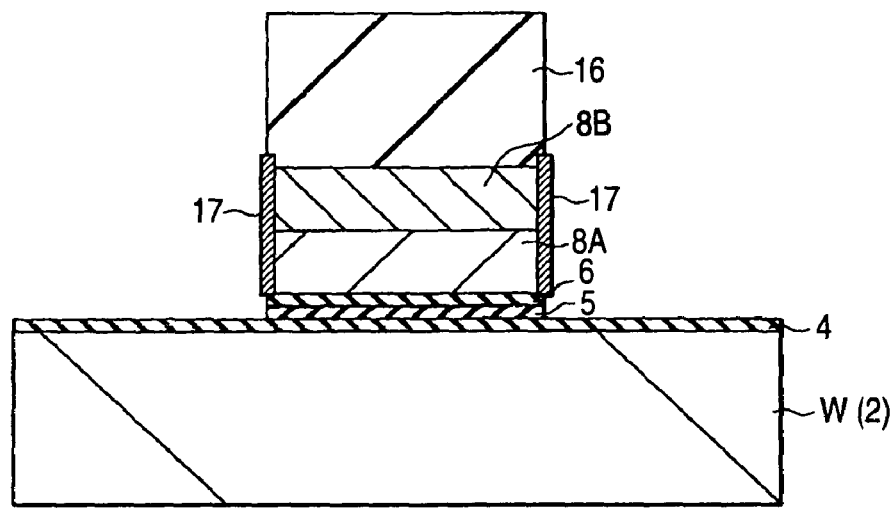
FIGS. 9A and 9B are sectional views of steps up to isotropic etching of the charge storage film.
Figure 9B:
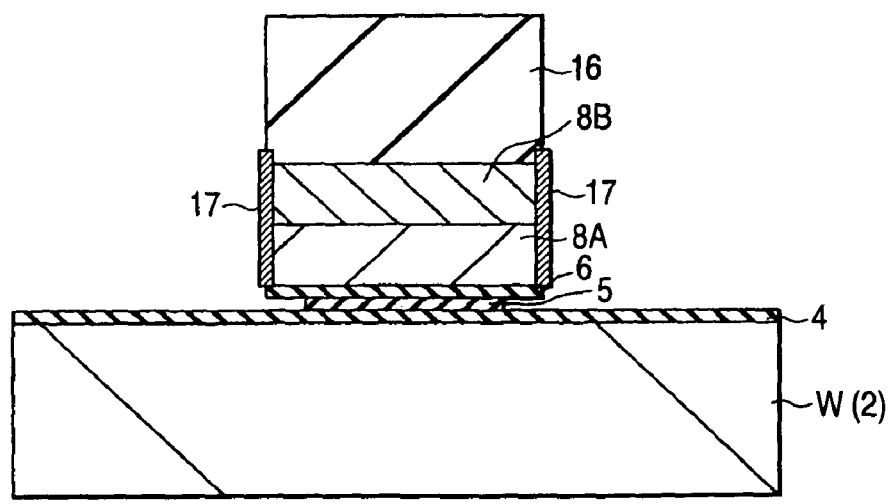
Figure 10:
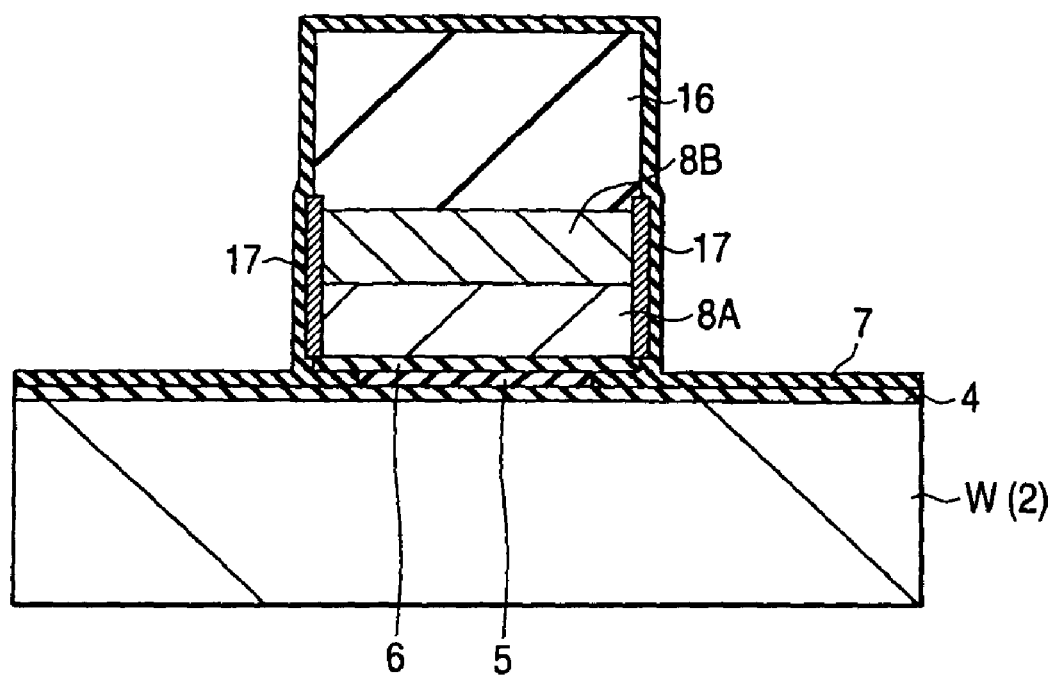
FIG. 10 is a sectional view after formation of a third insulating film.

In steps corresponding to FIG. 9A to FIG. 10, a part of the nitride film, which is the charge storage film 5 of the ONO film, is removed.

The sides of the tungsten silicon film 8B and the doped polysilicon film 8A already exposed are slightly oxidized to be protected from etching and a thin oxide film 17 is formed on the sides (FIG. 9A). Thereafter, only the nitride film (the charge storage film 5), which is present on at least a portion to be the drain region 21 (see FIG. 1A) of the ONO film present between the gate electrode 8 (the tungsten silicon film 8B and the doped polysilicon film 8A) and the well W (2), is removed by wet or dry isotropic etching (FIG. 9B). In that case, the charge storage film 5 on a region to be the source region 22 is simultaneously removed. To fill an oxide film in the portion where the nitride film (the charge storage film 5) is removed, an SiO$_2$ film is deposited as the third insulating film 7 by the same degree of thickness (8 [nm]) as the nitride film (the charge storage film 5) of the ONO film using the CVD method (FIG. 10). In depositing the SiO$_2$ film, CVD conditions for improving a filling characteristic are used.

In steps corresponding to FIG. 11A to FIG. 12B, the drain region 21 and the source region 22 are formed.

Figure 11A:
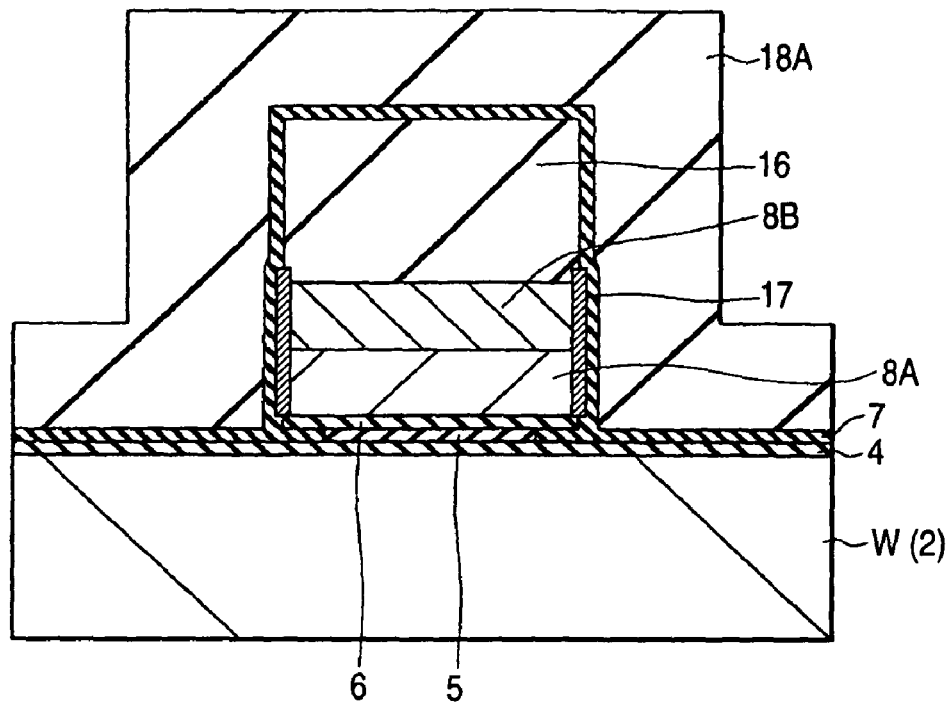
FIGS. 11A and 11B are sectional views of steps up to sidewall spacer formation.
Figure 11B:
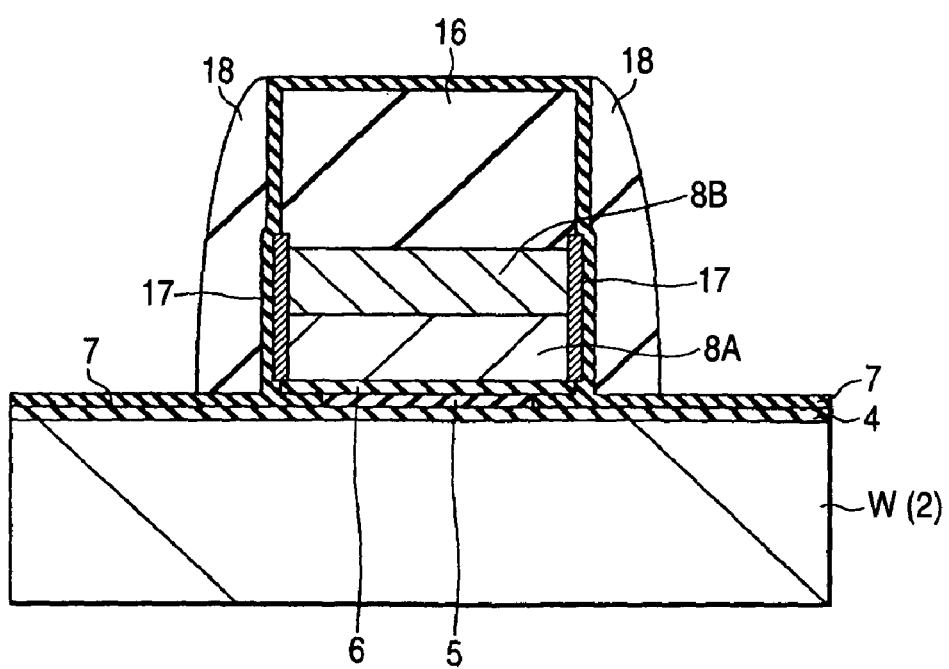

An oxide film 18A having thickness of 100 [nm] is deposited (FIG. 11A). The oxide film 18A is etched to form a sidewall spacer 18 (FIG. 11B).

Figure 12A:
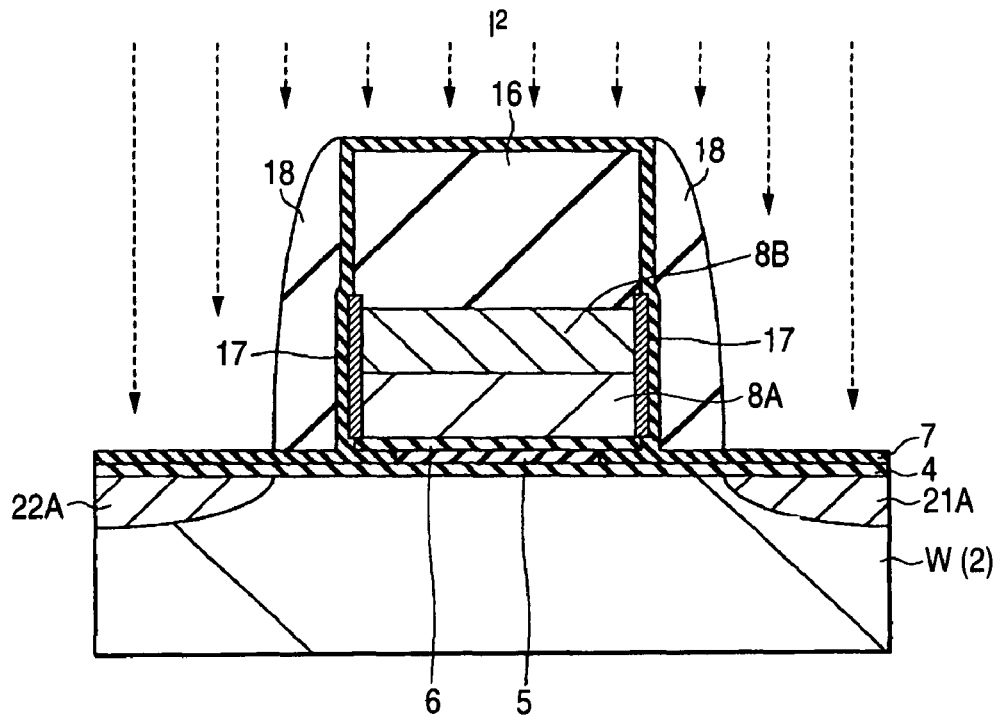
FIGS. 12A and 12B are sectional views of steps up to formation of an extension region.

N-type impurities (e.g., arsenic) are ion-injected with the sidewall spacer 18 as a mask (FIG. 12A). As ion injection conditions, energy is 50 [KeV] and a dose is $5 \times 10^{15}$ [cm$^2$]. Consequently, a contact region 21A of the drain region 21 and a contact region 22A of the source region 22, which are joined rather deeply, are formed. After the sidewall spacer 18 is removed and the semiconductor substrate 2 is cleaned, activation anneal (heat treatment in an inert gas) of the introduced impurities is performed. As anneal conditions, for example, temperature is 1000° C. and time is 10 seconds.

Figure 12B:
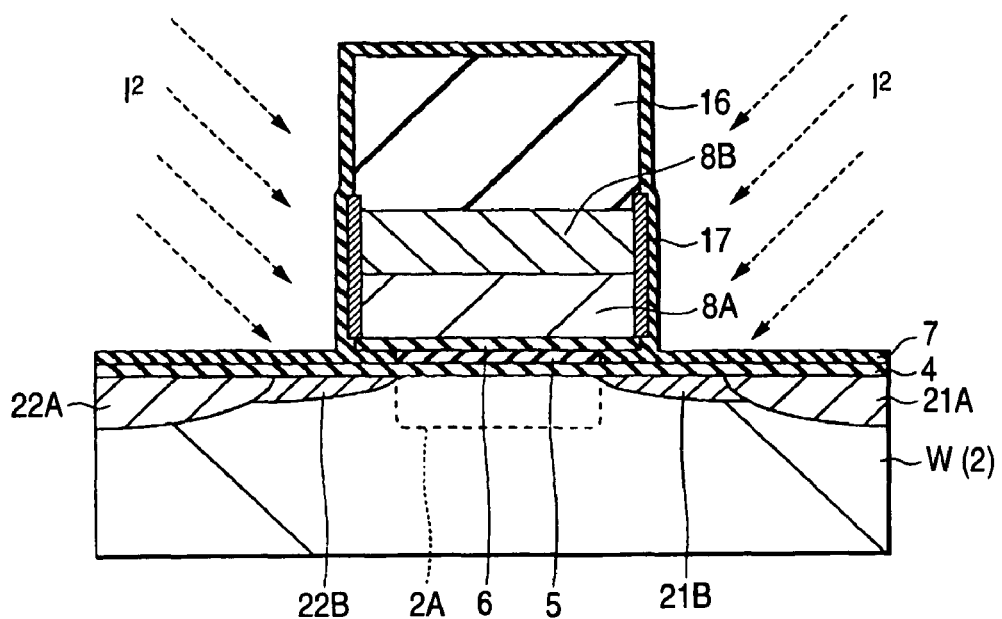

Although not shown in the figure, after a resist is formed as a protective film in a portion where the ion injection is not performed, N-type impurities (e.g., arsenic) is obliquely ion-injected with the resist as a mask (FIG. 12B). As ion injection conditions, energy is 70 [KeV], a dose is $5 \times 10^{13}$ [cm$^2$], and an angle is 7 degrees. Consequently, shallow extension regions 21B and 22B to be electric connection portions of the contact regions 21A and 22A and the channel formation region 2A are formed.

As a result, the drain region 21 including the contact region 21A and the extension region 21B and is formed. At the same time, the source region 22 including the contact region 22A and the extension region 22B is formed.

Thereafter, although not shown in the figure, after the resist used as the protective film is removed and the semiconductor substrate 2 is cleaned, activation anneal (heat treatment in an inert gas) of the introduced impurities is performed. As anneal conditions, for example, temperature is 950° C. and time is 10 seconds.

Thereafter, through deposit of an inter-layer insulating film and formation of a contact and an electrode, the MONO memory transistor 1 of the N-channel type shown in FIG. 1A is completed.

Oblique ion injection may be performed at a small angle in the state in FIG. 10 to form the extension region 21B of the drain region 21 and the extension region 22B of the source region 22 before forming the drain region 21 and the source region 22.

In the manufacturing method, it is possible to form the MONOS memory transistor in the structure in FIG. 1B by mainly adding the step of forming the thin oxide film 17, the step of isotropic etching of the charge storage film 5, and the step of depositing the third insulating film 7 and the oblique ion injection. In order to form the MONOS memory transistor in the structure in FIG. 1C, it is necessary to form the first insulating film 4 and the second insulating film 6 from different materials from which the first insulating film 4 and the second insulating film 6 can be selectively etched. In order to form the MONOS memory transistor in the structure in FIG. 1D, it is necessary to form the thin oxide film 17 from a material from which the first insulating film 4 and the second insulating film 6 can be selectively etched at a high ratio.

The MONOS memory transistor 1 in FIG. 1A is used as a type of a nonvolatile memory. For example, injection of channel hot electrons is used at the time of writing and injection of hot holes due to band-to-band tunneling is used at the time of erasing to discretely store charges in the charge storage film 5.

In writing of data, a positive bias is applied to the drain region 21 and a positive bias is applied to the gate electrode 8 with the source region 22 as a reference to cause the MONOS memory transistor 1 to perform a MOS operation. In this case, an N-type channel inversion layer is formed in the channel formation region 2A and electrons supplied from the source region 22 is accelerated in the channel, changed to hot electrons at the drain end, and surmounts the potential barrier of the first insulating film 4 to be injected into the drain end of the charge storage film 5.

In the case of the N-type channel memory transistor, when electrons are injected into the charge storage film 5, a threshold voltage of the charge storage film 5 rises. Writing of data is performed by arbitrarily selecting, in a memory cell array, a memory transistor into which electrons are injected.

The electrons injected function to weaken an electric field formed by a voltage applied to a gate at the time of readout. Thus, a channel is not formed in the memory transistor into which the electrons are injected. A channel is formed in a memory transistor into which electrons are not injected. Data is read out by sensing a potential between the drain region 21 and the source region 22 that changes according to whether a channel current flows.

In erasing of data, the drain region 21 is biased to zero or negative, a negative bias is applied to the semiconductor substrate 2 when necessary, and a positive bias is applied to the gate electrode 8. Under this bias condition, mainly at the end of the drain region 21 right below the overlap region 3A subjected to electric field dominance by the gate electrode 8, bend of bands becomes steep to cause band-to-band tunneling. Hot holes are caused by the band-to-band tunneling and subjected to an electric field formed by the gate electrode 8 and a moving direction of the hot holes is set. As a result, the hot holes are injected into the charge storage film 5. The holes injected electrically offset electrons injected earlier to return a threshold voltage to an initial state.

The definitions of writing and erasing of data may be opposite depending on a memory array system. In other words, a state in which electrons are injected into all the memory transistors is an erasing state. Holes may be written in an arbitrary memory cell to perform writing of data.

Charge distributions in the ONO film at the time of the operation will be explained.

Distributions of charges (electrons and holes) in the ONO film at the time of writing and erasing are shown in FIGS. 13 to 16. In this explanation, as an example, the MONOS memory transistor of the N-channel type is described.

Figure 13:
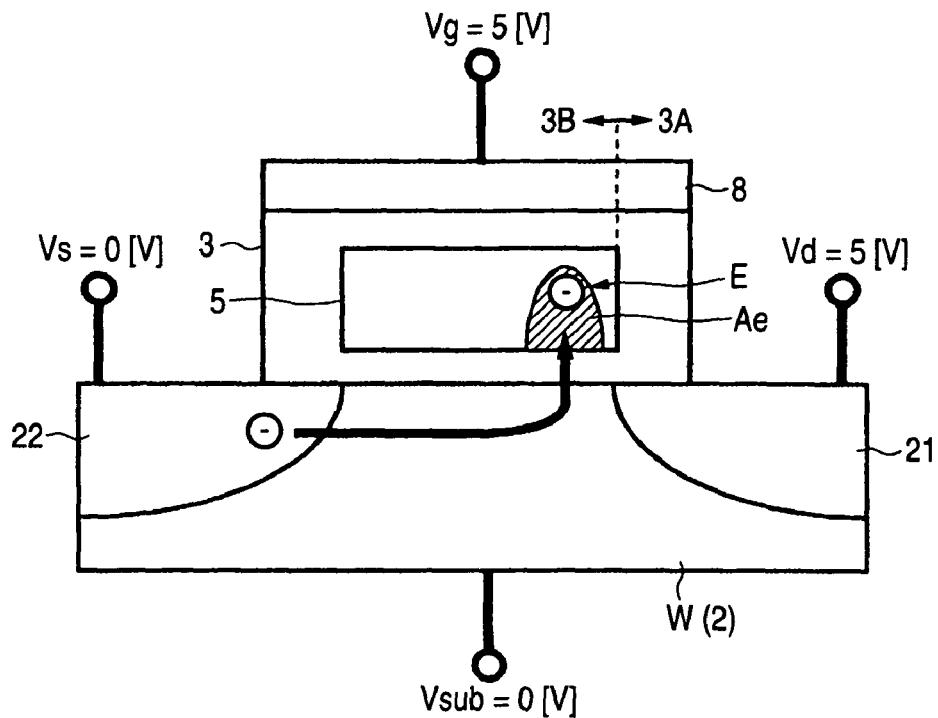
FIG. 13 is a diagram for explaining an injection distribution of electrons.

In the writing by the hot electron injection, as shown in FIG. 13, in a state in which a source voltage Vs is set to 0 [V] in the source region 22, positive biases, for example, a gate voltage Vg=5[V] and a drain voltage Vd=5[V] are applied to both the gate electrode 8 and the drain region 21. Consequently, electrons E are injected into a local portion closer to the drain in the charge storage film (the nitride film) 5 and stored. In FIG. 13, a distribution of the electrons E is indicated by a sign "Ae".

Figure 14:
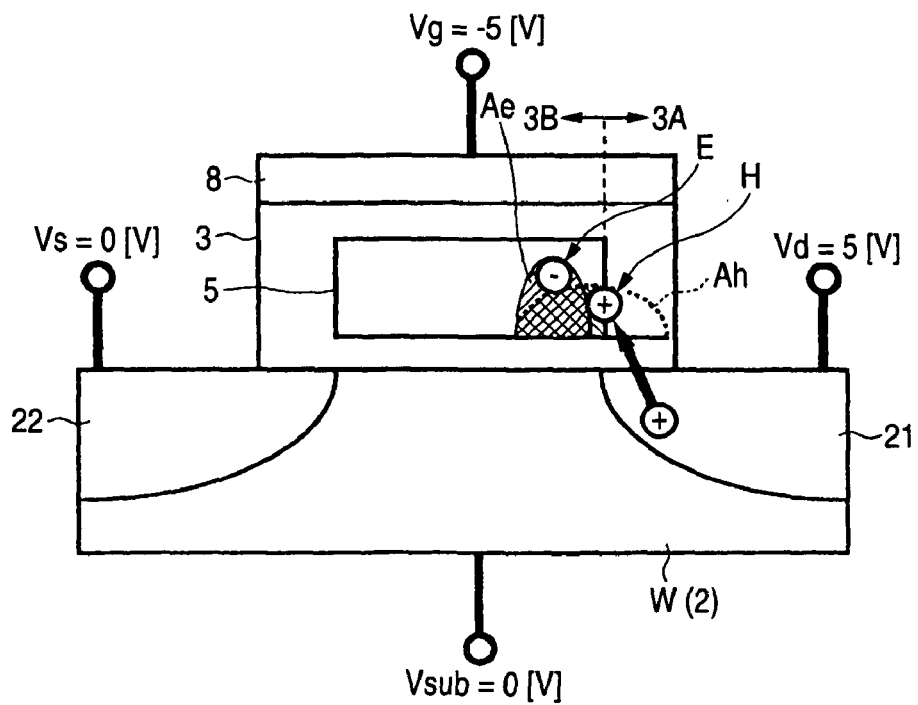
FIG. 14 is a diagram for explaining an injection distribution of holes.
Figure 15:
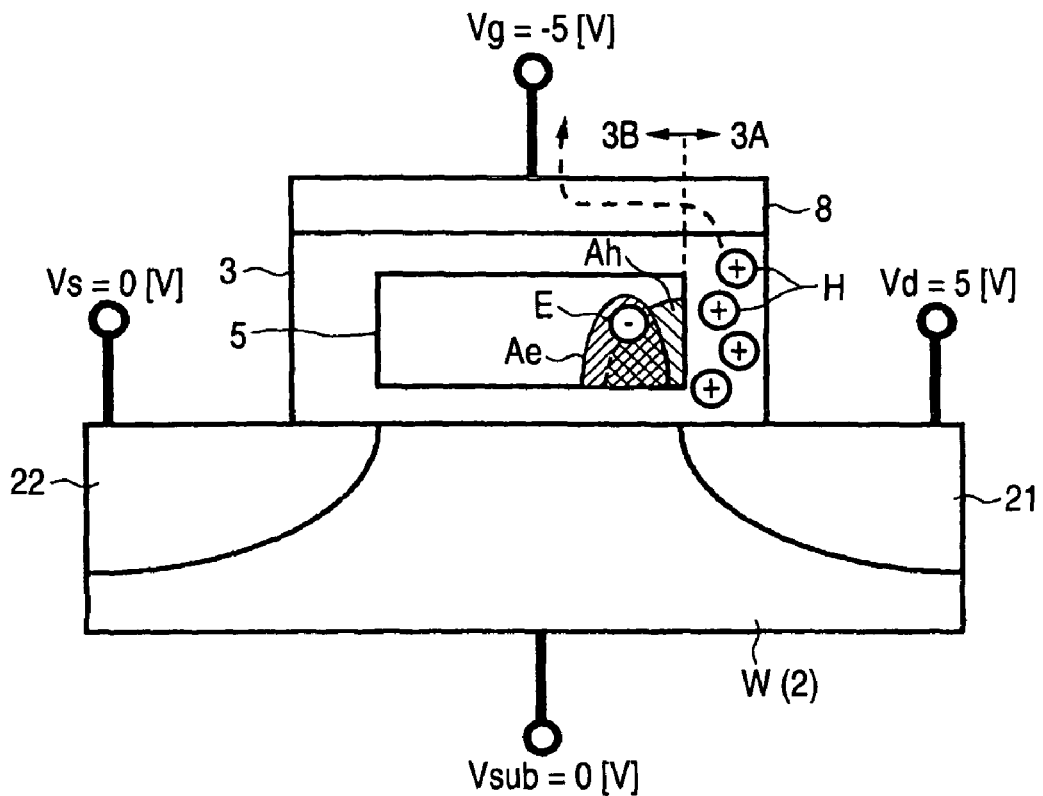
FIG. 15 is a diagram for explaining a disappearance path of holes in an overlap region.

Subsequently, injection of hot holes due to band-to-band tunneling is performed. In this hole injection, a negative bias, for example, a gate voltage Vg=−5[V] is applied to the gate electrode 8 and a positive bias, for example, a drain voltage Vd=5[V] is applied to the source region 21. In this case, the source region 22 is open or retains the ground potential (Vs=0 [V]) and the well W(2) retains the ground potential (Vsub=0 [V]). Consequently, bend of a band of a portion of the drain region 21 in contact with the overlap region 3A becomes steep and high energy charges due to band-to-band tunneling, that is, (hot) holes H are generated. The holes H are injected, as shown in FIG. 14, from the overlap region 3A of the laminated insulating film 3 to a part of the region (the charge storage region 3B) into which the electrons E determining a threshold are injected. In FIG. 14, a distribution of the holes H is indicated by a sign "Ah".

Figure 16:
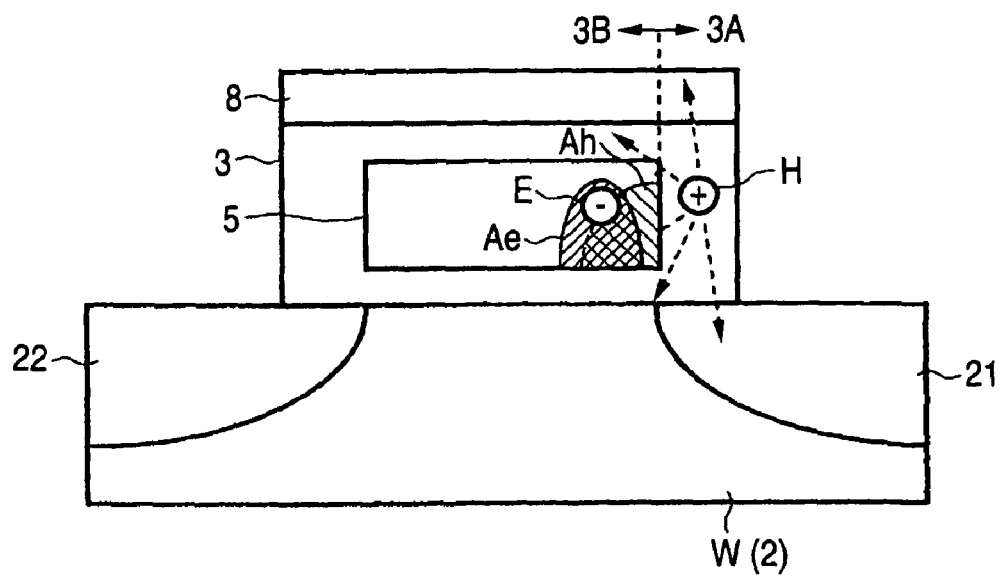
FIG. 16 is a diagram for explaining a spread path of residual holes in the overlap region.

Most of the holes H injected into the charge storage film 5 among the holes H injected are recombined with the electrons E, which are stored in the charge storage film 5 (the charge storage region 3B) already, and neutralized. On the other hand, the holes H (FIG. 15) injected into the overlap region 3A rather than the charge storage film 5 (the charge storage region 3B), although injected into the ONO film (the laminated insulating film 3), is moved to the gate electrode 8 by a negative bias (e.g., −5 [V]) applied to the gate electrode 8 because a charge retention ability in the region is incomparably low. The holes H disappears from the ONO film (the laminated insulating film 3) (FIG. 16).

In this case, although the holes H may remain in the third insulating film 7 a little, the holes H spread and disappear from the third insulating film 7 as time elapses. However, when the remaining holes H spread, it is likely that a part of the holes H spread into the charge storage film 5 (the charge storage region 3B) and are recombined with the electrodes E, which are already stored, and neutralized. However, since an amount of the holes H is small, the holes H scarcely affect the threshold determined by the electrons E stored.

According to this embodiment, the charge storage film 5 is not present at the end of the laminated insulating film 3 closer to the drain, that is, the overlap region 3A where it is highly likely that unnecessary holes not used for actual erasing (re-combination with electrons) remain. Thus, unnecessary holes are not stored. As a result, holes are not supplied into the charge storage film 5 (the charge storage region 3B) in which electrons are present. Therefore, there is an advantage that a retention characteristic is not deteriorated even if writing and erasing are repeated.

It should be understood by those skilled in the art that various modifications, combinations, sub-combinations, and alterations may occur depending on design requirements and other factors insofar as they are within the scope of the appended claims or the equivalents thereof.

What is claimed is:

1. A nonvolatile semiconductor memory device comprising:
    a semiconductor body with a first semiconductor region having first conductivity;
    a channel formation region that is a surface portion of the first semiconductor region having a second conductivity;
    a second semiconductor region that is adjacent the channel formation region and has the second conductivity;
    a third semiconductor region that is spaced apart from the second semiconductor region and adjacent the channel formation region at a side opposite the second semiconductor region and has the second conductivity;
    a laminated insulating film structure formed over the channel formation region; and
    a control electrode formed above the laminated insulating film, wherein
    the laminated insulating film includes a first insulating film, a charge storage film having a charge storage ability, and a second insulating film in order from the channel formation region side,
    the control electrode extends to a location that is perpendicularly above at least one of the second semiconductor region and the third semiconductor region, and
    the charge storage film being adjacent a third insulating film having a charge storage ability lower than that of the charge storage film, and wherein the charge storage film is surrounded by insulating material that is located perpendicularly below the control electrode, and further wherein the second and third semiconductor regions each extend to locations that are perpendicularly beneath the insulation at corresponding sides of the charge storage film, and further wherein substantially none of the charge storage film extends directly above the second and third semiconductor regions, the charge storage film being centrally located above and between the second and third semiconductor regions and extending proximate boundaries for the second and third semiconductor regions.

2. A nonvolatile semiconductor memory device according to claim 1, further comprising:
    a memory cell array in which memory cells including the first to the third semiconductor regions, the laminated insulating film, and the control electrode are integrated; and
    a peripheral circuit, wherein
    in an operation object memory cell selected in the memory cell array, the peripheral circuit is capable of executing a first charge injecting operation for biasing a region between the second semiconductor region and the first semiconductor region, biasing the control electrode to form an inversion layer channel in the channel formation region, and injecting first polarity charges into a local portion of the charge storage film on a side where the third insulating film is formed and a second charge injecting operation for, in reducing an amount of retained charges of the first polarity charges, biasing the second semiconductor region or the third semiconductor region on a side where the third insulating film is formed and the control electrode, causing band-to-band tunneling on a surface portion of the second semiconductor region or the third semiconductor region with which the third insulating film is in contact, and injecting second polarity charges caused by the band-to-band tunneling into the local portion of the charge storage film that retains the first polarity charges.

3. A method of manufacturing a nonvolatile semiconductor memory including: a first semiconductor region having first conductivity; a channel formation region that is a surface portion of the first semiconductor region and in which a channel having a second conductivity is formed; a second semiconductor region that is adjacent the channel formation region and has the second conductivity; a third semiconductor region that is spaced apart from the second semiconductor region and adjacent the channel formation region at a side opposite the second semiconductor region and which has the second conductivity; a laminated insulating film formed over the channel formation region; and a control electrode formed above the laminated insulating film, the laminated insulating film including a first insulating film, a charge storage film having a charge storage ability, and a second insulating film in order from the channel formation region side, the method of manufacturing a nonvolatile semiconductor memory device comprising:
    depositing respective insulating materials of the first insulating film, the charge storage film, and the second insulating film and a conductive material of the control electrode above the first semiconductor region in this order;
    forming at least one of the conductive material and the respective insulating materials as a pattern of the control electrode and exposing sides of the charge storage film; and
    etching the exposed sides of the charge storage film thereby retracting the charge storage film by a predetermined width closer to a center;
    filling a space at sides of the etched charge storage film with a third insulating film; and forming the second semiconductor region and the third semiconductor region, and wherein the charge storage film is surrounded by insulating material that is located perpendicularly below the control electrode, and further wherein the second and third semiconductor regions each extend to locations that are perpendicularly beneath the insulation at corresponding sides of the charge storage film, and further wherein substantially none of the charge storage film extends directly above the second and third semiconductor regions, the charge storage film being centrally located above and between the second and third semiconductor regions and extending proximate boundaries for the second and third semiconductor regions.

* * * * *